United States Patent [19]

Moon et al.

[11] Patent Number: 5,326,709
[45] Date of Patent: Jul. 5, 1994

[54] WAFER TESTING PROCESS OF A SEMICONDUCTOR DEVICE COMPRISING A REDUNDANCY CIRCUIT

[75] Inventors: Hong-bae Moon, Jeonlabuk-do; Bon-youl Ku, Daeku; Gi-seung Song; Tae-wook Seo, both of Kyungki-do, all of Rep. of Korea

[73] Assignee: Samsung Electronics Co., Ltd., Kyungki-do, Rep. of Korea

[21] Appl. No.: 993,007

[22] Filed: Dec. 18, 1992

[51] Int. Cl.⁵ .................... G01R 31/26; H01L 21/66
[52] U.S. Cl. ................................ 437/8; 437/922; 148/DIG. 93
[58] Field of Search ............... 437/922, 52, 8, 923; 148/DIG. 162, DIG. 93; 156/653; 257/529

[56]        References Cited
       U.S. PATENT DOCUMENTS

| 4,455,194 | 6/1984 | Yabu et al. | 156/653 |
| 4,536,949 | 8/1985 | Takayama et al. | 437/922 |
| 4,665,295 | 5/1989 | McDavid | 437/922 |
| 4,795,720 | 1/1989 | Kawanabe et al. | 437/52 |
| 4,816,422 | 3/1989 | Yerman et al. | 437/8 |

Primary Examiner—Olik Chaudhuri
Assistant Examiner—H. Jey Tsai
Attorney, Agent, or Firm—Cushman, Darby & Cushman

[57] ABSTRACT

A wafer testing process of a semiconductor device provided with a redundancy circuit. The process comprises a step of removing a passivation film above a pad and link portion, pre-laser testing, laser-repairing, and final quality marking using an off-line inking method. Therefore, fabrication-test processes are simplified to one step by adopting the off-line inking method, thereby achieving productivity improvement, quality enhancement, and reduction of throughput time.

9 Claims, 6 Drawing Sheets

WAFER TESTING PROCESS OF A SEMICONDUCTOR DEVICE COMPRISING A REDUNDANCY CIRCUIT

BACKGROUND OF THE INVENTION

1. Field of the Invention

The present invention relates to a manufacturing method of a semiconductor memory device, and more particularly to a simplified wafer quality testing and repairing process of a semiconductor memory device achieving higher productivity of memory devices such as DRAMs, SRAMs, etc., which have a redundancy circuit.

2. Description of the Related Art

The current increasing integration trend of memory devices allows shortening of the distance between lines, so defects tend to increase throughout the manufacturing process, which seriously reduces yields. Therefore, semiconductor manufacturers have adopted a redundancy technique for achieving higher productivity by restraining the yield decrease which may result from processing deficiencies. The redundancy technique replaces a slightly defective circuit resulting from poor processing with a reserve circuit in repairable chips.

For example, in a semiconductor memory circuit, quality enhancement is achieved by integrating into chips reserve blocks of reserve rows and columns, and replacing the row or column of a block containing a faulty bit of a regular cell array with a reserve row/column block. This redundancy technique is very effective in DRAMs and SRAMs in which cells of identical function are arranged. To replace a faulty row or column of a memory device having a faulty bit with a fully functional row or column, a program device and method for deactivating the faulty row/column and activating the reserve one is required. The best-known redundancy program device and method therefor is a fuse composed of polysilicon resistors, and the like, and an electrical fuse method for electrically blowing the fuse. Another redundancy device and method therefor is a link of polysilicon, polycide, etc., and a laser beam method for cutting off this link by applying the laser beam.

The electrical fuse method requires a transistor for high current driving, control circuits and a special pad for supplying current, etc., for cutting off the fuse, to be integrated onto the chips. The required inclusion of the circuits needed to cut the fuse is disadvantageous because they occupy too much chip area, and significantly delay program access time. However, the electrical fuse method is advantageous because testing and repairing equipment are inexpensive and high reliability is achievable by protecting the fuse portion with a protective film.

The laser beam method is very expensive because the initial cost of the testing and repairing equipment is very high, and high throughput is required to stabilize the laser beam and to determine the exact position of the laser beam. However, the laser beam method is advantageous, for the redundancy circuit design is easy and a plurality of links can be arranged in a very small area in the chip economically utilizing the chip area. Accordingly, due to the current ultra-minimization and high integration trends of semiconductor memory devices, the laser beam method is becoming more prevalent.

The wafer testing process of the laser beam method comprises a pre-laser testing step, a laser repairing step, and a final quality classifying step. To shorten the test time while maintaining the device's characteristics and quality, a method has been adopted by which a circuit with enough flexibility for designing and processing is to be searched and the test item with no defect is to be skipped. However, defective chips can be include in the skipped items which can be caused by process variables shifting frequently thereby inevitably reducing the yield in the subsequent package testing process.

Consequently, a new method is desired to enable the final quality classifying step to be skipped, while increasing the package yield in the wafer testing process of a redundancy memory product.

SUMMARY OF THE INVENTION

An object of the present invention is to simplify and optimize a testing process for a wafer having a plurality of semiconductor devices with redundancy circuits. The present invention comprises a step of removing a passivation layer from wafer above pad and program element portions of each semiconductor device. This is followed by pre-laser repair testing of each device, laser repair of those devices requiring repair, and final quality marking using an off-line inking method. The testing process according to the present invention advantageously increases productivity and device quality, and reduces throughput time.

BRIEF DESCRIPTIONS OF THE DRAWINGS

Further features and advantages will become more apparent from the following and more particular description of the preferred embodiment of the invention as illustrated in the accompanying drawings in which the same reference characters generally refer to like parts throughout the description, and in which.

DETAILED DESCRIPTION OF THE INVENTION

Figure 1:
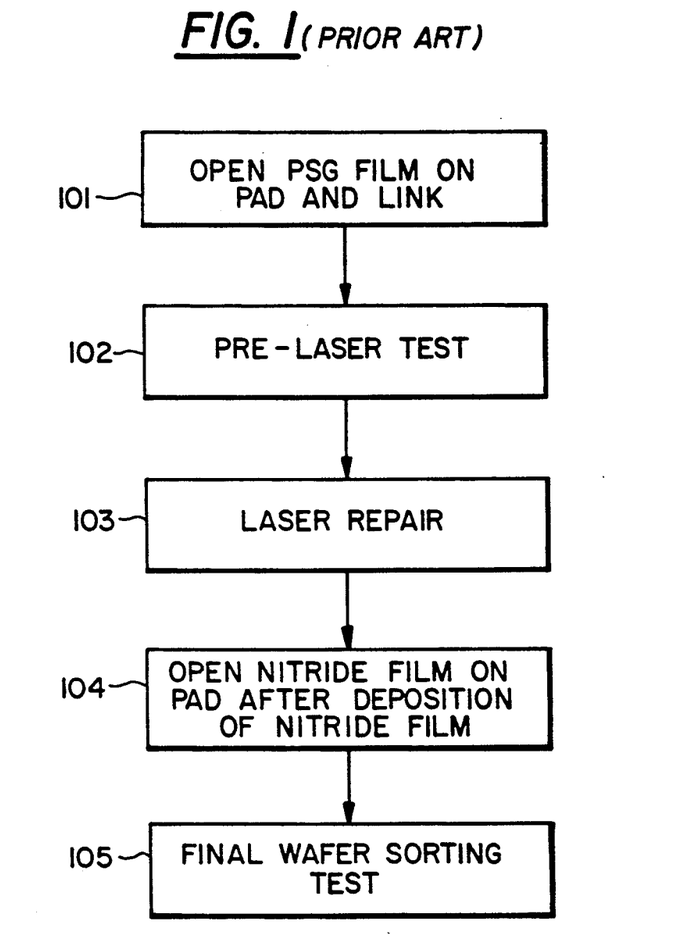
FIG. 1 is a process flowchart of a conventional wafer testing process.
Figure 2:
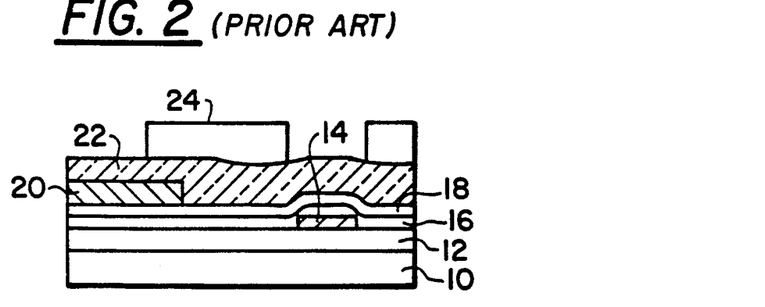
FIG. 2 through FIG. 5 are sectional views showing a two-step manufacturing process of the conventional wafer testing process.
Figure 3:
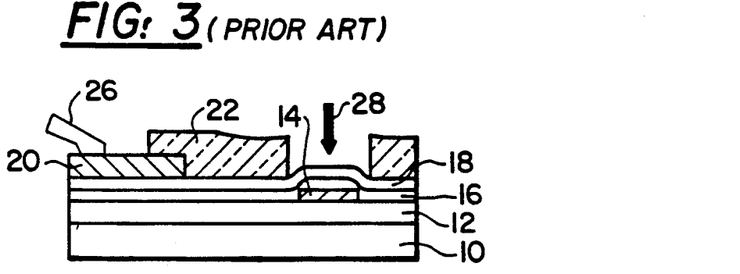

FIG. 1 through FIG. 5 show a typical semiconductor device for which the conventional wafer testing process will be illustrated. An oxide film 12 is formed on a substrate wafer 10. Typically, a link 14 is formed on the oxide film 12. An HTO film 16 is deposited on the link 14 and the oxide film 12. Conventionally, a PSG film 18 is formed on the HTO film 16. A pad 20 is formed on the PSG film 18. Typically, a passivation film 22 approximately 6,000 Å thick is then deposited on the entire surface. A photoresist pattern 24 is formed through ordinary photography etching on the wafer. The photoresist pattern 24 is used as a mask for selectively removing the passivation film 22, i.e. the PSG film 18 on pad 20 and above link 14. As shown in FIG. 3, by using the photoresist pattern 24, the PSG film 18 is selectively removed exposing pad 20 and the PSG film above the link 14, thereby reducing cutting misses due to the protecting film thickness on the link 14 in the laser repairing process (step 101).

Figure 4:
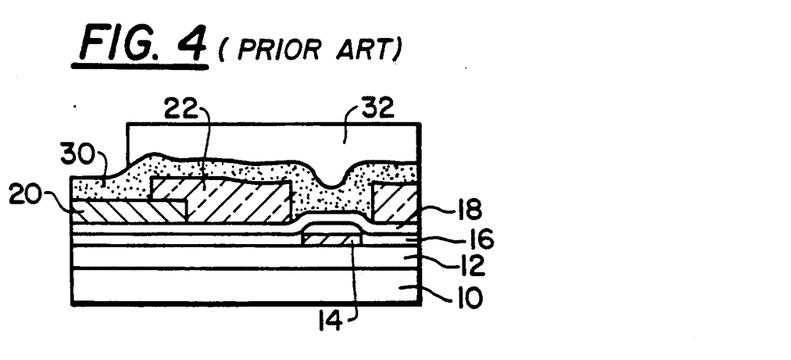
Figure 5:
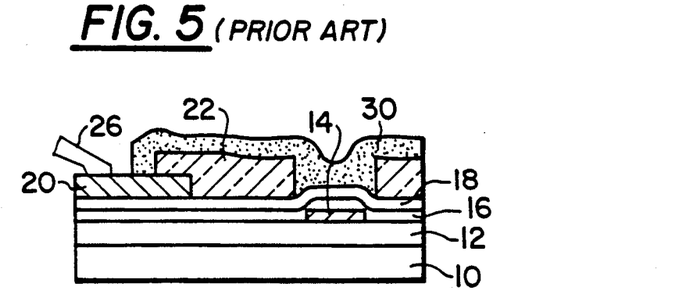

After finishing photography etching, a wafer is loaded onto probe equipment (e.g., EG2001X), whereby a probe contacts the open pad, and then a pre-laser test is executed by test equipment (e.g., Q2/52). According to the pre-laser test results, a wafer map is made showing which chips on a wafer are good or bad (step 102). After the pre-laser test, the wafer is loaded on laser equipment (e.g., 9000D) for laser repairing, and this laser equipment searches repairable chips (each marked with an "R" in FIG. 9) according to the transferred pre-laser test result, and inspects and cuts off the designated link with a laser beam. Therefore quality is enhanced by deactivating a faulty row or column, activating a normal reserve row or column, and replacing the former with the latter (step 103). A wafer which has been thus laser-repaired is loaded once again on the deposition equipment, and a nitride film 30 approximately 6,000 Å thick is deposited over the entire surface. This nitride film 30 protects the cut off link portion from contamination which can be caused by physical impact, humidity, temperature or other factors in the fabrication process. Next, a photoresist pattern 32 is formed on the nitride film 30 by an ordinary photoresist process. The photoresist pattern 32 is used as an etching mask for removing the nitride film 30 on the pad 20 as shown in FIG. 4. As shown in FIG. 5, the pad 20 is exposed to provide a link section to connect metal lines during assembly of the device.

Thereafter, the wafer is brought to the final quality testing step (step 105) through a back-lap process for physically grinding the back side of the wafer by about 100 μm. In the final quality testing step, every die on a wafer is scanned and tested automatically in order to choose only faulty dies on a wafer, and to package the good dies. Then, each faulty die is marked with a 2 mm diameter ink dot (typically referred to as a poorness mark) by an on-line inking method.

The conventional wafer testing process is problematic because wafers are frequently contaminated due to dust and the like. Satisfactory quality and reliability are unobtainable unless clean-room conditions are properly maintained because the test is a repetition of a 2-step process, i.e. fabrication-testing-fabrication-testing.

Additionally, throughput time cannot be decreased because the conventional wafer test process goes through the 2-step process. Furthermore, a sample test is executed after the repairing process according to the pre-laser test results. If the results of the sample test show at least 95% of the dies are not defective, then the inking process is skipped, otherwise faulty dies are inked with the wafer map from the pre-laser results without testing whether the repaired dies have been repaired. A yield decreases as large as the number of unrepaired dies results and it would be difficult to cope with a package yield decrease due to defects in the redundancy circuit or cutting misses in laser repairing.

Therefore, the present invention utilizes a one step fabrication-testing process, thereby simplifying processing and overcoming the problems of the conventional technique. The details of a preferred embodiment of the present invention will be explained in reference to FIG. 6 to FIG. 8.

Figure 6:
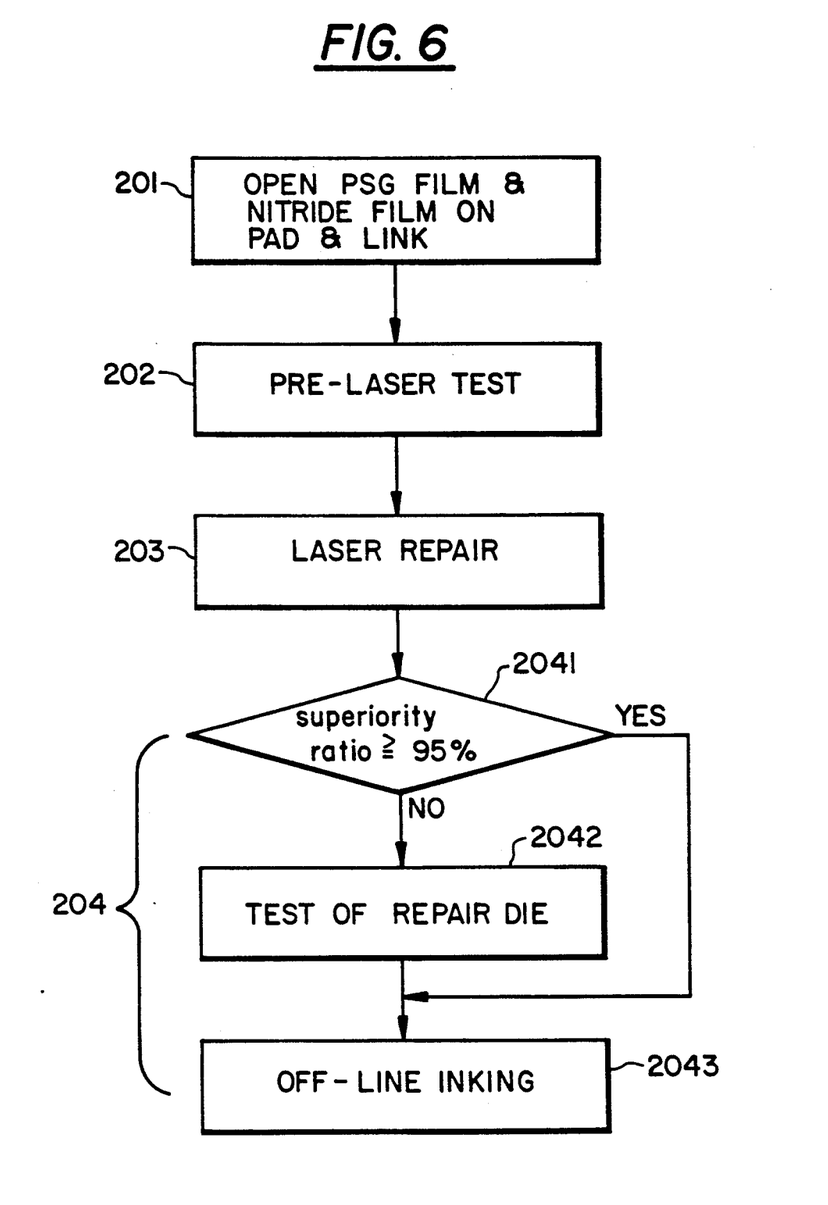
FIG. 6 is a flowchart explaining a wafer testing process according to the present invention.
Figure 7:
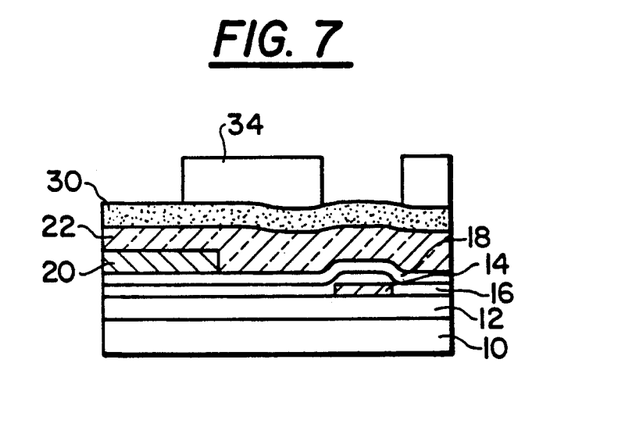
FIGS. 7 and 8 are sectional views explaining a simplified one-step manufacturing process of a wafer testing process according to the present invention.
Figure 8:
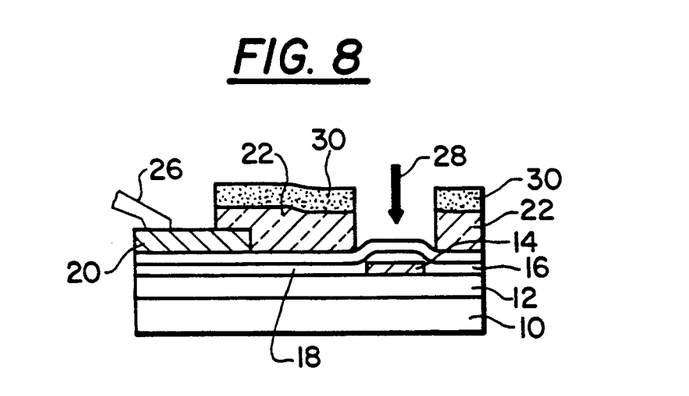

Referring to FIG. 6, a wafer testing process according to the present invention comprises a step of opening a protection film on a pad and link (step 201), a pre-laser testing step (step 202), a laser repairing step (step 203), and a final quality testing step (step 204). In the step of opening the protection film on a pad and link (step 201) as shown in FIG. 7, PSG film 22 and nitride film 30 are sequentially deposited less than approximately 6,000 Å thick on a wafer on which the device has been formed as in FIG. 1. Afterwards, the wafer undergoes a back-lap process, and photoresist pattern 34 for removing a protection film on the pad 20 and link 14 is formed on nitride film 30 by an ordinary photography process. Subsequently, as shown in FIG. 8, the photoresist pattern 34 is used as an etching mask so that nitride film 30 and PSG film 22 may be etched completely removing the protection film on pad 20. To make the oxide film's thickness less than 8,000 Å which is required to do laser-repair on link 14, PSG film 18 is over-etched so that the remaining oxide film's thickness should be less than 5,000 Å. As demonstrated above, the cutting miss ratio can be lowered by over-etching the portion above link 14 making it thin. That is, according to the present invention, deposition and etching steps are to proceed simultaneously so that the two fabricating steps of the conventional method are reduced to one, so throughput can be remarkably increased. Additionally, in the subsequent laser-repairing process, because PSG film and nitride film exist on the alignment mark part, it appeared that alignment mark discrimination would be difficult, and thus the part to be cut would not be cut exactly where desired. However, a reticle is changed and an alignment mark part is opened during the etching process, improving the quality of the product.

The pre-laser testing step (step 202) is to optimize the testing conditions for increasing the accumulated yield. Considering the characteristics of memory devices such as DRAM or SRAMs in general, as temperature increases, the mobility of electrons, their drift velocity and yield voltage decreases so that the characteristics become more influenced by noise. Normally, the consumed current increases in the stand-by condition and decreases in the dynamic condition. The refresh characteristic, one of the most important characteristics of a DRAM, decreases sharply as the temperature increases, and under higher temperatures, becomes poor in comparison with normal operating temperature characteristics. In the conventional wafer testing process, final wafer classification testing proceeds in a normal operating temperature and emphasizes the filtering DC and AC parameter deficiencies, a yield drop in package testing must be willingly accepted for the part showing poor device characteristics according to the temperature increase.

Conventionally, the chips are tested for problems in the fabrication process as well as process stabilization in the package instead of in the wafer itself. Therefore, assembly cost increases, and feedback time for adjusting for the problems originated in the fabrication process is lengthened as much as the time required for assembly and package testing. Thus, more stringent testing is necessary at the wafer level.

Accordingly, in the present invention, along with the process simplification, optimization of many factors in the pre-laser test is effected so as to enhance the accumulated yield itself as well as the package yield. The effect of noise in the wafer level is used to determine conditions which can be used to discriminate good dies from bad so as to increase the accumulated yield only by way of a pre-laser test. One step of the testing temperature condition is determined by finding the poor temperature point for each parameter according to the temperature of the device to be tested, and the weakest test item which has a lot of fault factors in the package test is applied to the repairing test so that repairable chips can replace faulty circuits with redundancy circuits.

The laser repairing step (step 203) is the same as the conventional method described above, so a detailed explanation thereof is omitted.

The final quality testing step (step 204) comprises a step (step 2041) of judging if the percentage of good dies versus bad dies (goodness rate) is greater than or equal to 95% by performing a sample test after finishing the laser-repairing, a step (step 2042) of selecting and testing only repairable dies if the goodness rate is below 95%, and a step (step 2043) of off-line inking performed after step of 2041 or 2042.

Figure 9:
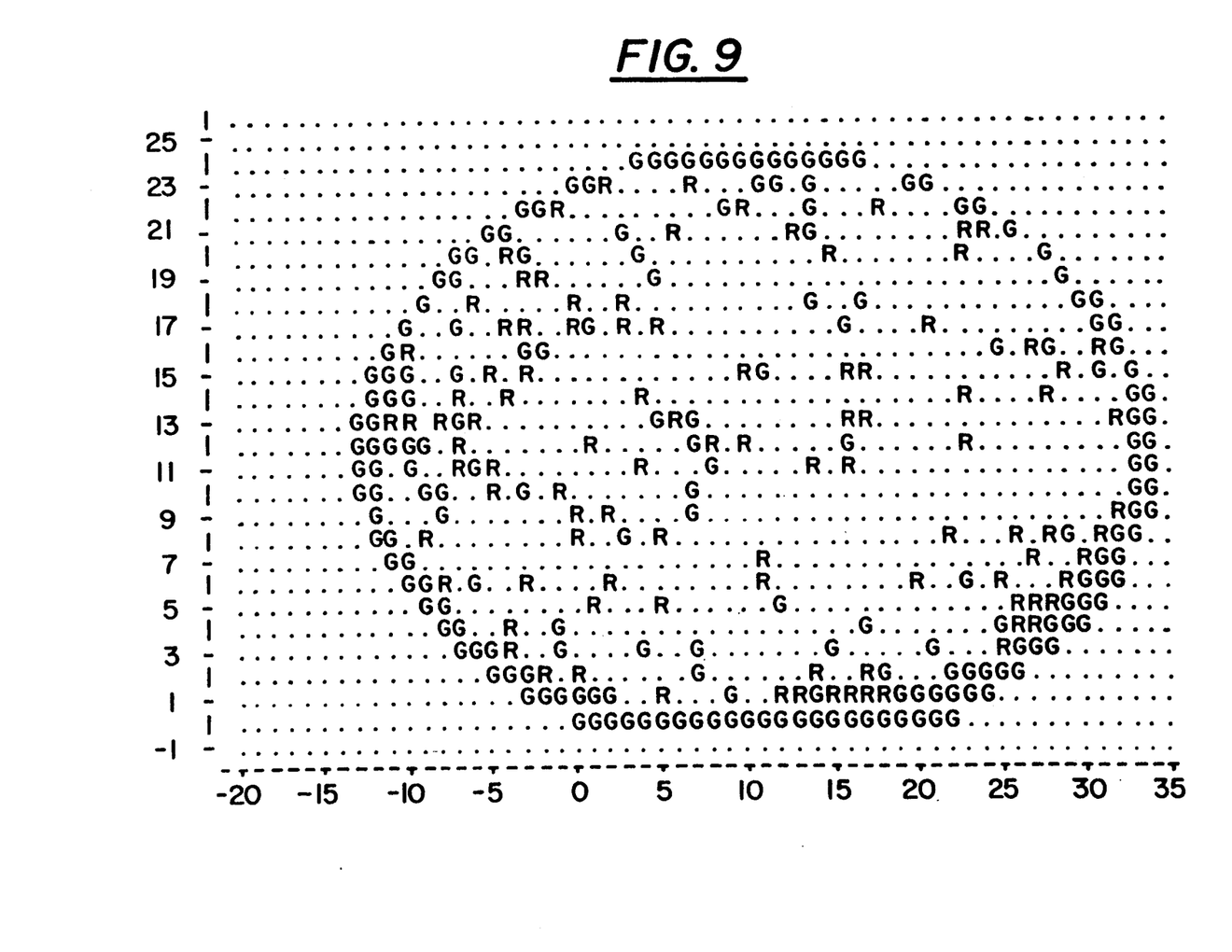
FIG. 9 is a wafer map of the result of a pre-laser test.
Figure 10:
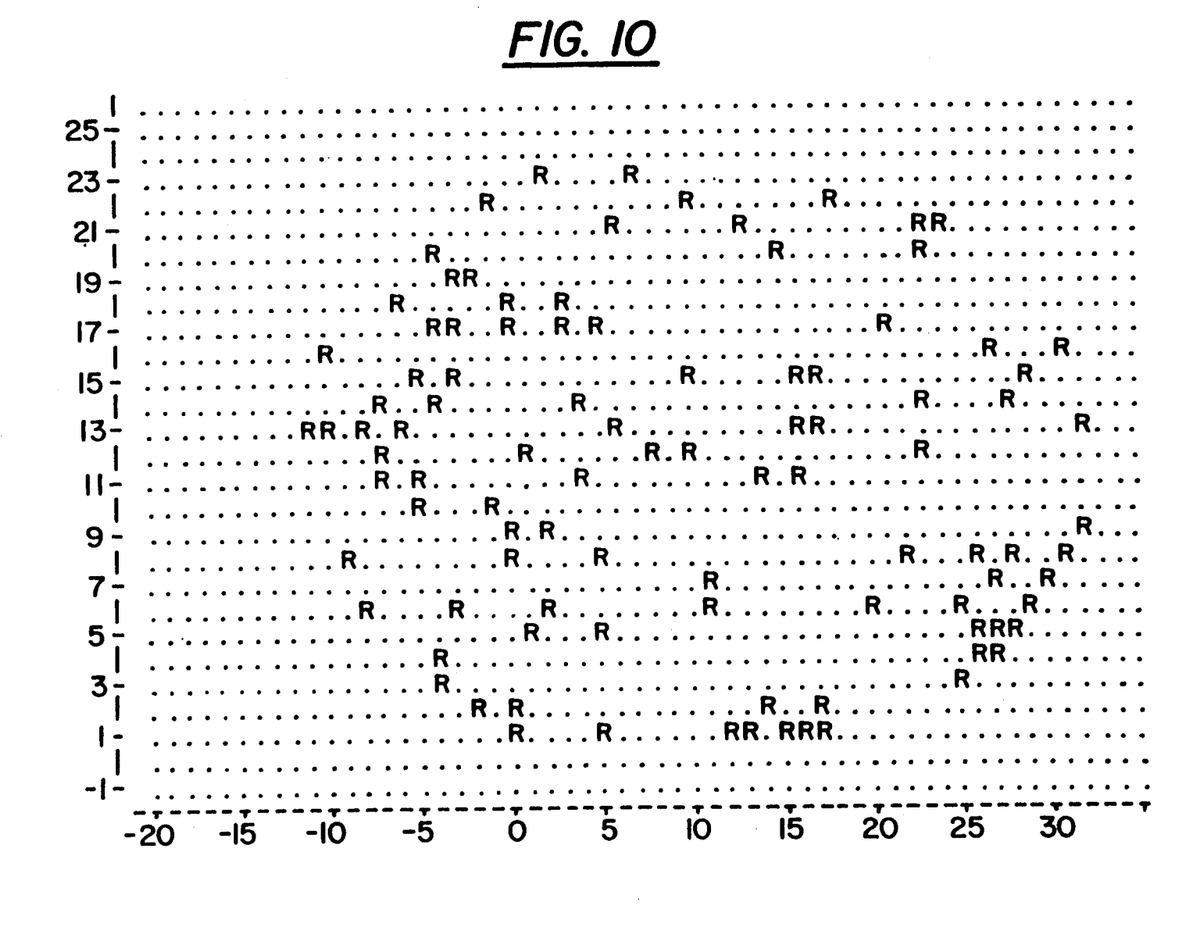
FIG. 10 is a wafer map which extracts the position information about the repairable chips according to the present invention.

Relating to step 2042, only repairable dies (marked "R") are extracted from the wafer map of the pre-laser test result as shown in FIG. 9, the extracted information as shown in FIG. 10 is temporarily stored in the memory of test equipment (Q2/25), and this stored information is loaded into the probe equipment EG2001X, after which, with the X-Y coordinates of repairable dies according to the information, only repairable dies are to be tested by the test and probe equipment. To choose only poor dies from a wafer and to package only the good dies by an off-line inking process, poorness indication markings for identifying the quality in the assembly die attach process is to be inked on faulty dies. The poorness indication markings are a dot mark of a diameter not less than 20 mil.

The off-line inking method, which is different from the on-line inking method for inking while proceeding with real time testing, executes a test first, and carries out inking for only poor dies by using a PC/AT computer system with the Binning result which is a reference to decide quality according to the X-Y position of a tested wafer and other test results. Hence, the off-line inking method provides faster inking velocity, more uniform inking dot size, and easier control than the on-line inking method, so that increases in down-time due to inking equipment defects is reduced, thereby enhancing productivity and facilitating the automation of the fabrication process.

As described above, the present invention is to simplify and optimize a wafer test process. Explanations about the advantages due to this invention in comparison with the conventional method are as follows.

1. As shown in Table 1, from the device developing step, a reticle for process simplification is manufactured. The manufacturing process and wafer testing process periods can be shortened by more than 48 hours in comparison with the conventional method, so that the productivity of the test process can be enhanced by more than 50% in mass-production.

TABLE 1

| | process Sequence | Conventional method | Present method | Changes |
|---|---|---|---|---|
| 1 | PSG deposit | 6000 ± 500 Å | 6000 ± 500 Å | Same |
| 2 | Photography process | Perform | Omit | Changed |
| 3 | Bake before etching | Perform (130° C. 10 min) | Omit | Changed |
| 4 | Ethcing process | Perform | Omit | Changed |
| 5 | Photosensing film dry process removal | Perform | Omit | Changed |
| 6 | Photosensing film wet process removal | Perform | Omit | Changed |
| 7 | Laser Test | Perform | Omit | Changed |
| 8 | Cleaning after laser-test | Perform | Omit | Changed |
| 9 | Nitride film deposit | 6000 ± 500 Å | 6000 ± 500 Å | Same |
| 10 | Photography process | Perform photosensing film thickness (17500 Å) | Perform photosensing thickness (21500 Å) | Same (Reticle changed) |
| 11 | Etching process | nitride film etching | nitride film + oxide film etching | Changed |
| 12 | Rear surface coating | Perform photosensing film thickness (30000 Å) | Perform photosensing film thickness (30000 Å) | Same |
| 13 | Etching process | Perform 425 ± 25 μm | Perform 425 ± 25 μm | Same |

2. As shown in Table 2, according to the present invention, lower reliability which can be generated from high-temperature, high humidity or temperature shock becomes a serious concern since the passivation film is removed above the link after laser-repairing. However, improved results have been obtained from a result of reliability test

TABLE 2

| (a) PLCC PCT 204 hours test result | | |
|---|---|---|
| | Quantity | Deficiency Rate |
| Prime product by the present method | 3000 ea | 0% |
| Repair product by the present method | 3000 ea | 0% |
| (b) DIP PRT result | | |
| | Lot number and period | PRT result |
| Conventional method | April 1 to April 30, 1990 | 0.13% |
| Present method | 78 lot | 0.06% |
| (c) PCT (NO VCC, 121° C./100%/2 atm) | | | | | |

| | Quanity | Failure in Times | | | | Deficiency Rate |
|---|---|---|---|---|---|---|
| | | 96 | 168 | 300 | 500 | |
| Prime product by the present | 500 ea | 1 | 1 | 0 | 0 | 0.4% |

TABLE 2-continued

| method | | | | | |
|---|---|---|---|---|---|
| Repair product by the present method | 500 ea | 2 | 1 | 0 | 0 | 0.6% |
| Repair product by the conventional method | 300 ea | 0 | 0 | 1 | 1 | 0.6% |

TABLE 3

| | P/L | EDS | P/B | H/S | CUM Yield | PRT |
|---|---|---|---|---|---|---|
| Conventional condition | 94.5% | 97.3% | 97.3% | 96.5% | 83.9% | 0.1% |
| Optimized condition of the present invention | 93.9% | — | 97.3% | 96.9% | 88.5% | 0.0% |

TABLE 4

| Item | | Pre-laser conventional condition | Optimized condition | Changes | EDS Conventional condition | BIN2 test (FAR ≦ 95%) Optimized condition | Changes |
|---|---|---|---|---|---|---|---|
| Open | | Y | Y | — | Y | Y | — |
| Short | | Y | Y | — | Y | Y | — |
| ST | TTL | Y | Y | — | Y | Y | — |
| BY | CMOS | N | Y | limit = 750 µA | Y | Y | Limit = 750 µA |
| In Leakage | | N | Y | limit = 10 µA | N | Y | Limit = 10 µA |
| Out Leakage | | N | Y | limit = 10M | N | Y | Limit = 10 µA |
| Repair Test | | Y Vcc = 4V | Y Vcc = 4/6V | High Margin | Y Vcc = 4/5/6V | Y Vcc = 4/6V | Vcc = 5V |
| | | Ref = 20ms Pattern = March | Ref = 20 ms Pattern = made for checking March and Adcomp at the same time | Vcc = 6V Adcomp Pattern Added | Ref = 4ms Pattern = Adcomp + Static Ref | Ref = 20ms Pattern = made for checking March and Adcomp at the same time | poorness is skipped, Refresh condition is poor. |
| TEMPERATURE | | 85° C. | 83° C. | Same as in H/S | Room | 83° C. | Same as in H/S |

3. As shown in Tables 3 and 4, the accumulated yield increases by about 4.6% due to the optimization of the pre-laser test.

4. As shown in Table 5, by adopting the off-line inking method, rework of the laser and pre-laser test is possible, and inking miss ratio due to inking equipment defects is reduced while avoiding quality deterioration due to inking.

TABLE 5

| | Conventional On-line Inking | Present invention's Off-line Inking |
|---|---|---|
| Advantages | Additional equipments for inking is unnecessary because inking is being done while testing | 1. Faster inking speed (3–4/sec)<br>2. Easy control of dot size<br>3. Delay time due to inker poorness is decreased.<br>4. Essential for automation<br>5. Essential for process simplification<br>6. One inker equipment is enough for a pararrel test more than two item tests<br>7. Productivity increase due to work reduction.<br>8. Removal of yield decrease due to poor testing |
| Disadvantages | 1. Setting more than 2 inkers is difficult when testing more than 2 items<br>2. In case of poor test due to inker poorness and other causes, it becomes the causes for inker removal and reliability deficiency.<br>3. Inking is impossible when introducing the process simplification. | 1. Data processing must be executed carefully because laser repairing, BIN2 test, off-line inking are to be accomplished by the pre-laser test result.<br>2. An additional process is added. |

5. Probing quality of a pad can be improved and the number of probe particles as well as the number of wafer particles can be brought to zero by one testing step.

What is claimed is:

1. A testing process for a wafer containing a plurality of semiconductor chips, each chip having first and second passivation layers, redundancy circuits with program elements and pads for electrical connection thereto, comprising the steps of:
   (a) selectively removing a first passivation layer portion disposed over said pads of each said semiconductor chip to obtain a plurality of exposed pads and selectively removing a second passivation layer portion disposed over said program elements of each said semiconductor chip;
   (b) electrically testing every chip on said wafer through said exposed pads to identify defective chips on said wafer, including identification of defective but repairable chips and defective and unrepairable chips;
   (c) repairing said repairable chips by cutting said program elements on said repairable chips with a laser beam to obtain repaired chips;
   (d) testing a sample of said repairable chips after said laser repairing step to determine a representative goodness ratio of successfully repaired repairable chips versus unsuccessfully repaired repairable chips;
   (e) quality testing all of said repairable chips, identified in step (b) and which underwent laser repair in step (c), to determine which of said repairable chips were successfully repaired and which of said repairable chips were unsuccessfully repaired, if said goodness ratio is less than a threshold value, said step of quality testing all of said repairable chips being omitted if said goodness ratio is greater than or equal to said threshold value; and
   (f) quality marking each said defective unrepairable chip and each of said unsuccessfully repaired repairable chips as determined by said quality testing step.

2. A wafer testing process as in claim 1, wherein said passivation film is composed of any one selected from the group consisting of a PSG film, a nitride film and a combination thereof.

3. A wafer testing process as in claim 1, wherein step a is carried out by sufficiently over-etching an intermediate insulation film interposed between said passivation film and said program element to make the thickness thereof less than 8,000 Å, for minimizing cutting-off failure of said program elements by said laser-beam.

4. A wafer testing process as in claim 1, wherein step b is carried out at an operational temperature of said semiconductor device, thereby optimizing the pre-laser test temperature.

5. A wafer testing process as in claim 1, wherein step d is carried out by performing said final quality test first, and subsequently performing said final quality marking on faulty chips in accordance with results from said final quality test.

6. The wafer testing process as in claim 1, wherein said quality testing step includes testing each chip for a test condition which exhibits a plurality of potential fault factors.

7. A wafer testing process as in claim 1, wherein said step a is carried out by opening an alignment mark portion for laser-repairing while simultaneously performing pad-opening.

8. A testing process as claimed in claim 1, wherein said threshold value in step (e) is 95%.

9. A wafer testing process comprising the steps of:
   (a) forming a first protective film over a semiconductor wafer having a plurality of semiconductor chips formed thereon, each said chip having at least one pad for electrical connection and at least one program element;
   (b) forming a second protective film on said first protective film, said second protective film being a final protective film for said semiconductor wafer;
   (c) removing a portion of said first and second protective films by a single photolithography step to expose said at least one pad and said at least one program element on each said chip on said wafer;
   (d) electrically testing every chip on said wafer through said exposed pads to obtain repairing information, including identification of defective but repairable chips and defective and unrepairable chips;
   (e) repairing said defective but repairable chips on said wafer according to the repairing information obtained in step (d) by cutting said program elements with a laser beam; and
   (f) quality marking defective chips on said wafer according to the repairing information obtained in step (d).

* * * * *